United States Patent
Kalte et al.

(10) Patent No.: US 11,187,748 B2
(45) Date of Patent: Nov. 30, 2021

(54) PROCEDURE FOR REVIEWING AN FPGA-PROGRAM

(71) Applicant: dSPACE digital signal processing and control engineering GmbH, Paderborn (DE)

(72) Inventors: Heiko Kalte, Paderborn (DE); Dominik Lubeley, Paderborn (DE)

(73) Assignee: DSPACE DIGITAL SIGNAL PROCESSING AND CONTROL ENGINEERING GMBH, Paderborn (DE)

(*) Notice: Subject to any disclaimer, the term of this patent is extended or adjusted under 35 U.S.C. 154(b) by 24 days.

(21) Appl. No.: 16/665,019

(22) Filed: Oct. 28, 2019

(65) Prior Publication Data

US 2020/0132766 A1 Apr. 30, 2020

(30) Foreign Application Priority Data

Oct. 30, 2018 (EP) .................................... 18203310

(51) Int. Cl.
*G01R 31/3185* (2006.01)
*G01R 31/3183* (2006.01)
*G01R 31/3193* (2006.01)

(52) U.S. Cl.
CPC ......... *G01R 31/318519* (2013.01); *G01R 31/31935* (2013.01); *G01R 31/318357* (2013.01)

(58) Field of Classification Search
None
See application file for complete search history.

(56) References Cited

U.S. PATENT DOCUMENTS

| 6,400,173 B1* | 6/2002 | Shimizu ............ G01R 31/2884 324/754.07 |
| 6,781,398 B2* | 8/2004 | Adler .................... G11C 29/56 324/762.02 |
| 10,083,043 B2 | 9/2018 | Kalte |
| 10,318,687 B2 | 6/2019 | Kalte et al. |
| 10,394,989 B2 | 8/2019 | Kalte et al. |
| 2006/0079970 A1* | 4/2006 | Ward .................. G05B 19/056 700/86 |
| 2010/0146338 A1 | 6/2010 | Schalick et al. |
| 2015/0370672 A1 | 12/2015 | Lenka et al. |
| 2016/0320451 A1 | 11/2016 | Wang et al. |
| 2018/0196103 A1* | 7/2018 | Champoux ...... G01R 31/31724 |
| 2019/0341091 A1* | 11/2019 | Sity .................... G11C 11/4076 |

* cited by examiner

*Primary Examiner* — Guerrier Merant
(74) *Attorney, Agent, or Firm* — Leydig, Voit & Mayer, Ltd.

(57) ABSTRACT

A method for detecting errors of a first field-programmable gate array (FPGA) program includes: receiving, by a monitoring program executed on a processor connected to an FPGA on which the first FPGA program is executed, a signal value read out from the first FPGA program; and comparing, by the monitoring program executed on the processor, the signal value to a reference value from a source other than the first FPGA program in order to detect errors of the first FPGA program.

14 Claims, 5 Drawing Sheets

PROCEDURE FOR REVIEWING AN FPGA-PROGRAM

CROSS-REFERENCE TO PRIOR APPLICATION

Priority is claimed to European Patent Application No. EP 18203310.0, filed on Oct. 30, 2018, the entire disclosure of which is hereby incorporated by reference herein.

FIELD

The present invention relates to a method for testing a field-programmable gate array (FPGA) program.

BACKGROUND

Despite error-free rapid control prototyping (RCP) simulator hardware, electrically tested communication links, correct FPGA bit streams and a properly programmed FPGA, malfunctions in an FPGA model can occur in reality. While some of these errors may be detected through simulation at the model or gate level, the effort required for this simulation, in particular the creation of the test environment, including the FPGA environment, can be very high, so that functional testing in the real environment can be much easier.

The "Spartan-6 FPGA Configuration User Guide (UG380 v2.10) Mar. 31, 2017" describes reading static configuration data from the FPGA and comparing these to original data.

SUMMARY

In an exemplary embodiment, the present invention provides a method for detecting errors of a first field-programmable gate array (FPGA) program. The method includes: receiving, by a monitoring program executed on a processor connected to an FPGA on which the first FPGA program is executed, a signal value read out from the first FPGA program; and comparing, by the monitoring program executed on the processor, the signal value to a reference value from a source other than the first FPGA program in order to detect errors of the first FPGA program.

BRIEF DESCRIPTION OF THE DRAWINGS

Exemplary embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
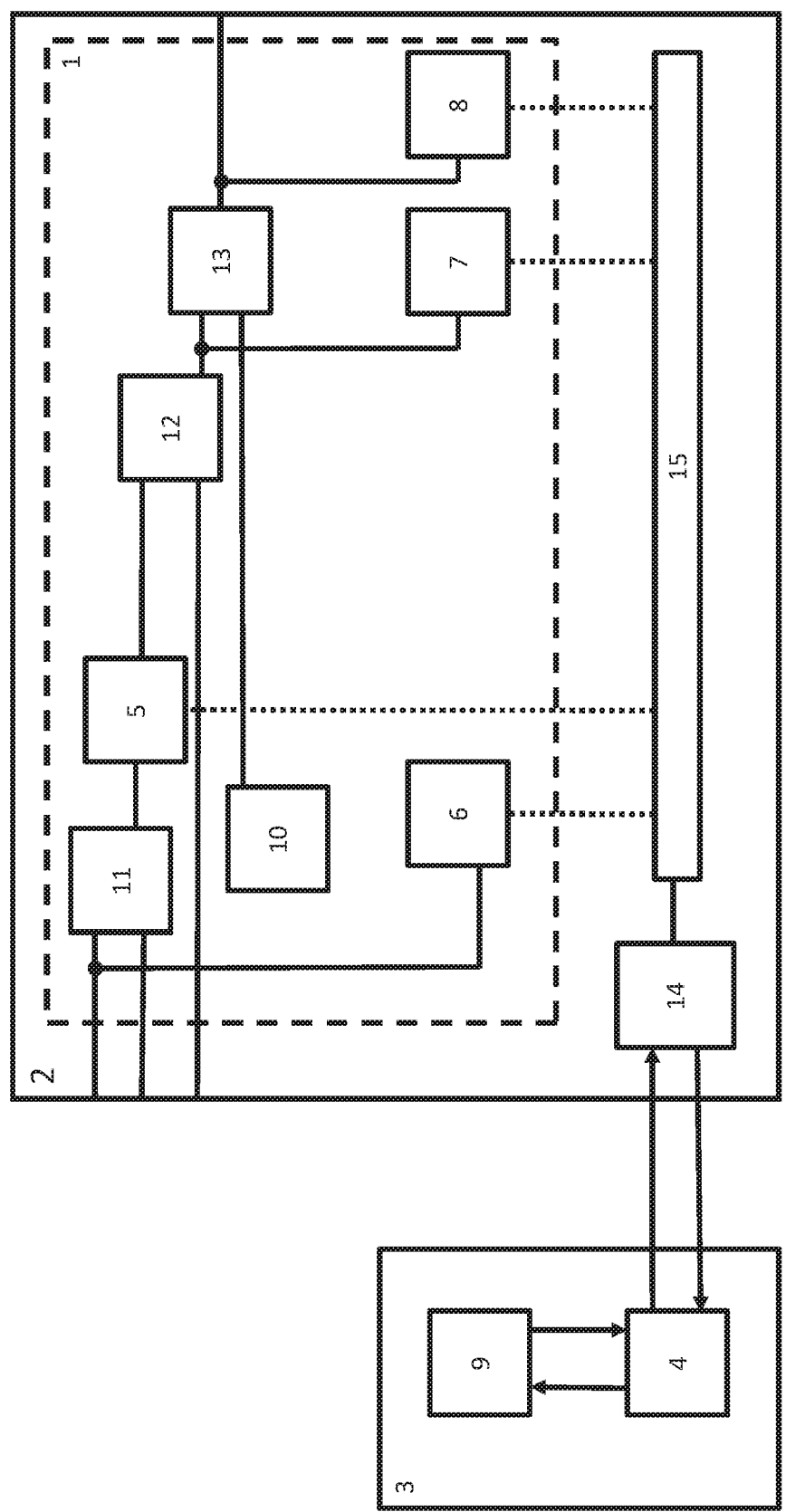
FIG. 1 is a schematic view of a first exemplary embodiment according to the present invention.

Exemplary embodiments of the present invention provide a method for detecting errors of an FPGA program, the FPGA program being executed on an FPGA, the FPGA being connected to a processor, a monitoring program being executed on the processor, a signal value being read out from the FPGA program and supplied to the monitoring program, the monitoring program comparing the signal value to a reference value from a different source in order to detect errors.

Signal values change during the execution of the FPGA program. In particular, signal values may be stored in registers, the registers being updated during the execution of the FPGA program. These signal values include signal values in shadow registers, such as are described in U.S. Pat. No. 10,394,989.

An advantage of the method according to an exemplary embodiment of the present invention is that it makes it possible to detect errors that are not due to incorrect configuration data. For example, a circuit may be detected to behave differently than expected during development or simulation. This may occur due to, for example, errors in the compiler or thermal changes during run-time. The detection of the error may be responded to, for example, by outputting of an error message, halting the FPGA program or starting a debugging program.

It will be understood that it is also possible compare a plurality of signal values to the same reference value. Likewise, a signal value may be compared to a plurality of reference values. For each comparison, a different rule may apply as to whether or not an error is detected. For example, in one comparison, an error may be present if the signal value is less than the reference value, and in another comparison, an error may be present if the signal value is greater than the reference value.

The processor on which the monitoring program is executed may be any form of processing unit. The execution unit used for the monitoring program may be a universal processor, a processor implemented in an FPGA, a processor created specifically for this task (application-specific integrated circuit (ASIC)), as well as a system on chip (SOC). Advantageously, the processor is not implemented on the FPGA to be monitored.

In an exemplary embodiment, a plurality of comparisons between signal values and reference values are performed and combined.

Through combination, it is also possible to detect more complex errors. For example, an error may be present if the signal value is less than a first threshold and, at the same time, greater than a second threshold. Such an error cannot be detected by a single comparison. In another example, an error may be present if a first signal value is equal to a first reference value and, at the same time, a second signal value is equal to a second reference value. Such an error cannot be detected by a single comparison.

In an exemplary embodiment, signal values are compared to reference values more frequently if their memory locations and/or the logic from which the values of memory locations are obtained are exposed to a higher thermal load.

Thermal loading, i.e. higher temperatures, generally increases the probability of errors in memories and faulty outputs from logic blocks. Therefore, it is advantageous that signal values which are stored in memory locations that are exposed to a higher thermal load be compared to reference values more frequently than signal values which are stored in memory locations that are exposed to a lower thermal load.

In an exemplary embodiment, the thermal load on the memory locations is estimated by a simulation.

The thermal load on the memory locations strongly depends on the activity of the logic elements in the immediate vicinity of the memory locations. Each switching operation of a logic element produces heat. Through simulation, it is possible to estimate which logic elements of the FPGA will switch more frequently than other logic elements during run-time of the FPGA program. Signal values in memory locations in the vicinity of the logic elements that switch more frequently are then compared to reference values more frequently than signal values in memory locations in the vicinity of logic elements that switch less frequently.

In an exemplary embodiment, the reference value is a predefined value.

Predefined reference values are available to the monitoring program prior to the execution of the FPGA program. With predefined reference values, the comparison to the read-out dynamic values can be performed very quickly because the reference values need not be made available first. The predefined reference values may be, for example, thresholds for signals. Through comparison, it is then possible to determine whether a signal value is within the specified limits.

In a further exemplary embodiment, the signal value and the reference value each specify a memory address in the BlockRAM of the FPGA.

The dynamic value may address, for example, a read or write access to the BlockRAM in the FPGA. In this case, the reference value may be a threshold for a memory area. This comparison makes it possible to detect whether a read or write access to an invalid memory area occurs. Alternatively, a reference value may be specified for individual memory addresses. For example, individual bits may indicate whether an access to the memory address is considered to be an error.

In an exemplary embodiment, an error of the FPGA program is detected if the signal value is greater than a first reference value and/or less than a second reference value.

In an exemplary embodiment, upon a write access to the BlockRAM of the FPGA, a reference value is set.

By setting a reference value following a write access, it is possible to update the valid memory area of the BlockRAM. This is useful, for example, if the intention is to detect write accesses to uninitialized memory. A write access initializes the memory area and makes read access to it permissible. Prior to the write access, read access is not permitted.

For purposes of implementation, logic that monitors write accesses to the BlockRAM may be implemented in the FPGA. Each time a write access is made, the corresponding reference value is updated. In an exemplary embodiment, the largest memory address of all previously performed write accesses is used as a reference value at any one time. A read access to a larger memory address is to be regarded as an error. In a further exemplary embodiment, the smallest memory address of all previously performed write accesses is used as a reference value at any one time. A read access to a smaller memory address is to be regarded as an error. The reference value corresponding to the largest memory address and the reference value corresponding to the smallest memory address may be used alternatively or in combination.

In an exemplary embodiment, the BlockRAM is divided into a plurality of partitions, and at least one reference value is used for each partition.

For each partition, a reference value corresponding to the largest memory address and/or a reference value corresponding to the smallest memory address can be used. The division into partitions makes monitoring for write accesses to invalid memory areas much more reliable. If a partition includes only a single memory address, a single bit is sufficient as a reference value. Dividing the BlockRAM into as many partitions as there are memory addresses allows for complete monitoring of the BlockRAM.

In an exemplary embodiment, the processor is connected to a further FPGA, and the reference value is read out from the further FPGA.

By reading the reference value from a further FPGA, it is possible to test the communication between the FPGA and the further FPGA. For this purpose, the signal value is read out from the FPGA prior to transmission to the further FPGA, and the reference value is read from the further FPGA upon transmission. If the signal value and the reference value should not be identical, an error in the communication is detected. Identity between the signal value and the reference value may also exist indirectly if the read-out signal value is changed in a known manner in the FPGA prior to transmission and/or if the transmitted value is changed in a known manner in the further FPGA prior to being read out as a reference value. Such a change may be known, for example, from the program code of the FPGA or the further FPGA.

In an alternative exemplary embodiment, the reference value is dynamically generated in the processor.

In case of dynamic generation, the reference value is generated in the processor during run-time of the FPGA. An example of a reference value generated in the processor is a value that is sent from the processor to the FPGA. The value received by the FPGA can then be read out as a signal value and compared to the value sent by the processor. If the values do not match, a communication problem exists and the error is detected. Another example is a value that is sent from the FPGA to the processor. Here, care must be taken to ensure that the FPGA sends the value to the processor via a path different from that via which the monitoring program reads out the value. If the value sent from the FPGA to the processor and the value read out by the monitoring program do not match, a communication problem exists and the error is detected.

In an exemplary embodiment, the monitoring program sends a stimulation value to the FPGA.

Knowing the stimulation value, the monitoring program can predict which value the signal value should assume at which point in time. If the read-out signal value does not match the predicted value, an error is detected. The stimulation value may be sent to the FPGA, for example, as a substitute for an input value. Alternatively, the stimulation value may be sent via a configuration port of the FPGA and overwrite an internal value of the FPGA.

In an exemplary embodiment, the stimulation value overwrites a constant in the FPGA program.

The overwriting of the constant may be performed, for example, with a shift register chain in the FPGA. For each constant that should be able to be overwritten, one register is implemented in the shift register chain. An enable signal causes the values from the shift register chain to be synchronously transferred into the working register and to overwrite the constants. These and other methods for overwriting constants are described in U.S. Pat. No. 10,318,687.

In an exemplary embodiment, the dynamic value is read out from the FPGA via a readback interface.

Reading out dynamic values from the FPGA via a readback interface has, inter alia, the advantage that no additional selection logic needs to be incorporated into the FPGA program. This saves resources and thus makes it possible to use larger FPGA programs. Methods for reading out signal values from the FPGA via a readback interface are described, for example, in U.S. Pat. Nos. 9,235,425 and 10,394,989. An example of a readback interface is the "internal configuration access port" (ICAP).

The present invention will now be described in more detail with reference to the drawings, in which like parts are designated by the same reference numerals. The illustrated exemplary embodiments are schematic; i.e. the distances and the lateral and vertical extents are not true to scale and, unless indicated otherwise, do not have any derivable geometric relations to each other either.

The illustration of FIG. 1 shows an FPGA program 1 that is executed on an FPGA 2. The FPGA is connected to a processor 3. A monitoring program 4 is executed on the processor 3. FPGA program 1 includes a plurality of registers in which signal values are stored and a plurality of logic elements. Signal values are changed during the execution of the FPGA program. A first signal value 5 is stored in a first register. Here, the first signal value is the output value of a first logic element 11. The first register serves as a buffer for first signal value 5 and makes it available as an input value to a second logic element 12. A second signal value 6 is an input value of the first logic element 11 and is supplied to FPGA 2 from outside. Second value 6 is stored in a second register. The second register is not used as a buffer because it does not make the second dynamic value available to any other element of the FPGA program. The second register is only used to hold second signal value 6 available for read-out. The second register is also referred to as a shadow register since it is irrelevant to the functionality of the FPGA program. A third signal value 7 is an output value of second logic element 12 and, at the same time, an input value of a third logic element 13. Third signal value 7 is stored in a third register. Like the second register, the third register is a shadow register. A fourth signal value 8 is an output value of third logic element 13 and leaves FPGA 2. Fourth signal value 8 is stored in a fourth register. Like the second register, the fourth register is a shadow register. A constant 10 is stored in a register. The register makes constant 10 available as input value of third logic element 13.

A reference value 9 is stored in a memory element on processor 3. Thus, reference value is 9 is a predefined reference value. Reference value 9 can be read by monitoring program 4. Monitoring program 4 communicates with a controller 14 present in the FPGA. Monitoring program 4 tells controller 14 with which signal values 5, 6, 7, 8 are to be read out at which point in time. Controller 14 reads out the signal values 5, 6, 7, 8 requested by monitoring program 4 from the registers via an internal read-out interface 15 and forwards them to monitoring program 4. An example of an internal read-out interface 15 is the "internal configuration access port" (ICAP).

Figure 2:
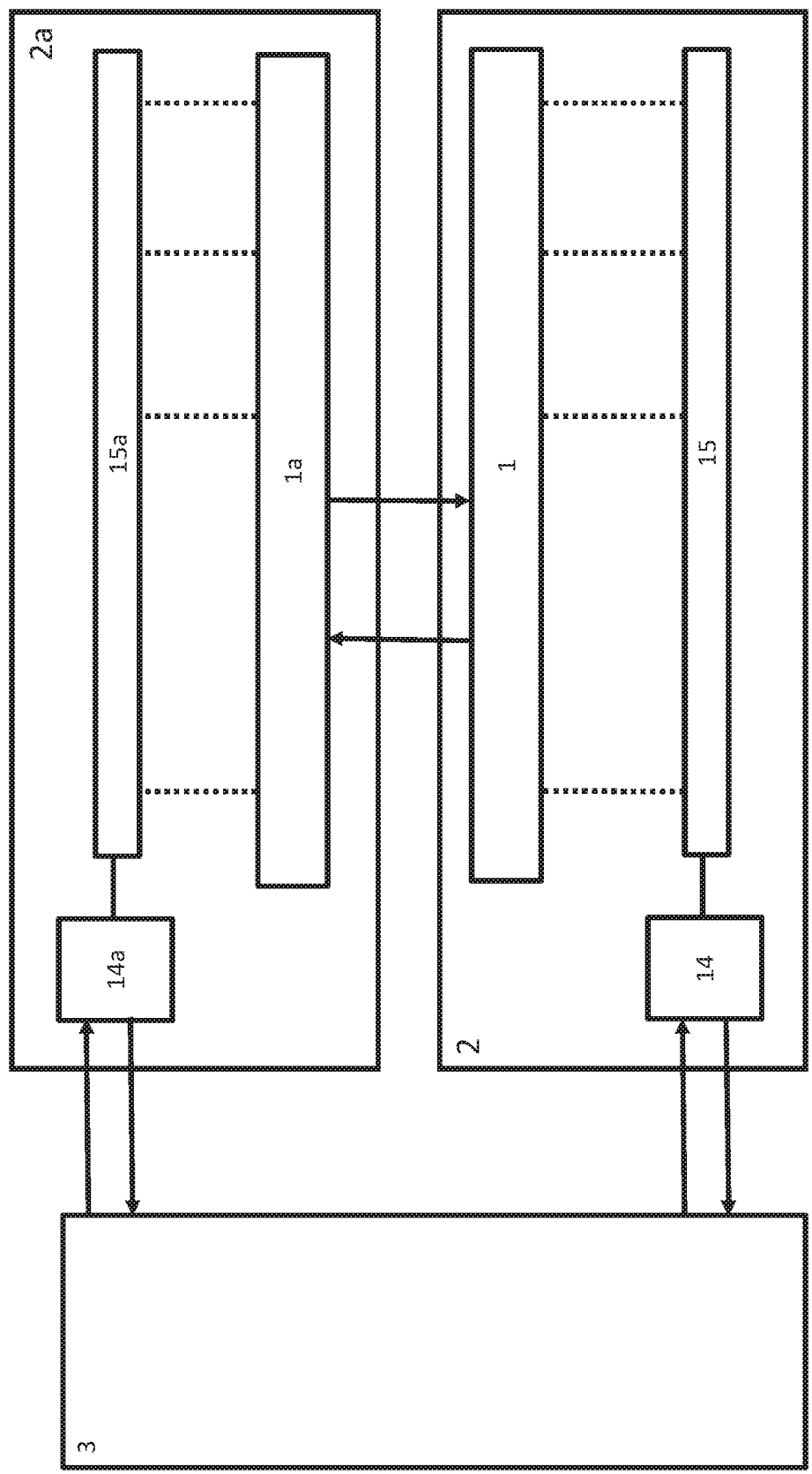
FIG. 2 is a schematic view of a second exemplary embodiment according to the present invention.

The illustration of FIG. 2 depicts a further exemplary embodiment. In the following, only the differences relative to the illustration of FIG. 1 will be described. FPGA 2, including FPGA program 1, and processor 3 are configured in the same way as described in FIG. 1, but are shown here in simplified form for improved clarity. In addition, a further FPGA 2a is present. The further FPGA 2a is identical in configuration to FPGA 2. A further FPGA program 1a is executed on the further FPGA 2a. The further FPGA 2a is connected both to FPGA 2 and to processor 3. FPGA program 1 and the further FPGA program 1a can exchange data. Processor 3 can communicate with a controller 14a present in the further FPGA 2a and tell controller 14a which values are to be read out from the further FPGA program 1a.

Monitoring program 4 reads from FPGA program 1 a signal value that FPGA program 1 sends to the further FPGA program 1a. Monitoring program 4 reads the received signal value as a reference value from the further FPGA program 1a. Errors in the communication between FPGA 2 and the further FPGA 2a can be inferred by monitoring program 4 from the comparison of the signal value from the FPGA program and the reference value from the further FPGA program.

Figure 3:
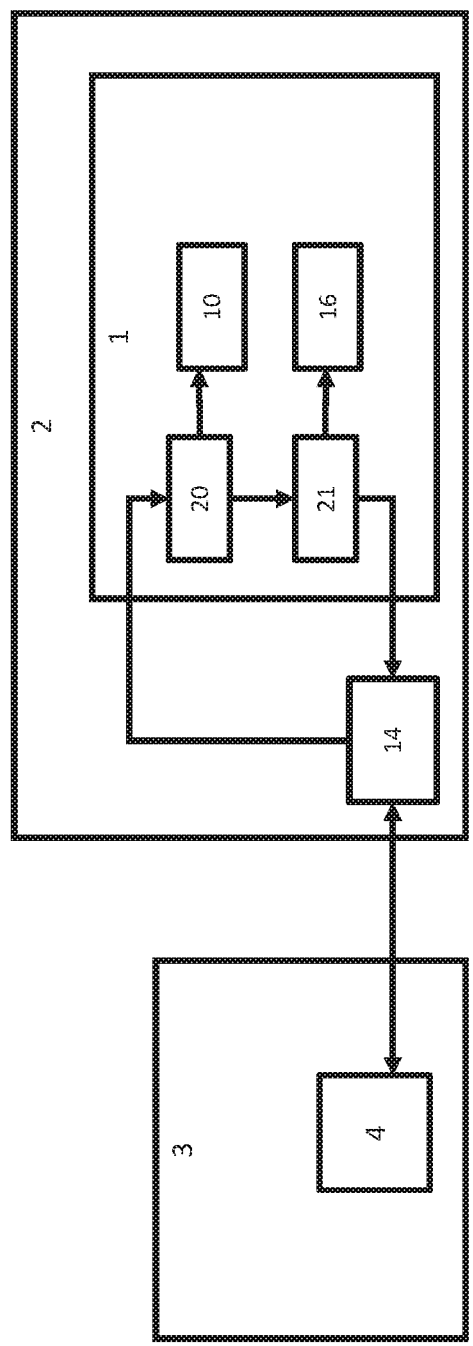
FIG. 3 is a schematic view of a third exemplary embodiment according to the present invention.

The illustration of FIG. 3 depicts a further exemplary embodiment. In the following, only the differences relative to the illustration of FIG. 1 will be described. FPGA program 1 has implemented therein a shift register chain having a first shift register 20 and a second shift register 21. Processor 3 can overwrite the contents of shift registers 20, 21 by way of controller 14. A special signal, called "enable signal," causes the contents of shift registers 20, 21 to be transferred into the working register of first FPGA program 1. For example, the content of first shift register 20 overwrites the value of the constant 10. The content of shift register 21 overwrites the value of a further register 16. If the mode of operation of FPGA program 1 is known, it is possible to predict when and how the change of constant 10 will affect signal values. Monitoring program 4 can read out the signal value and check it for correctness.

Figure 4:
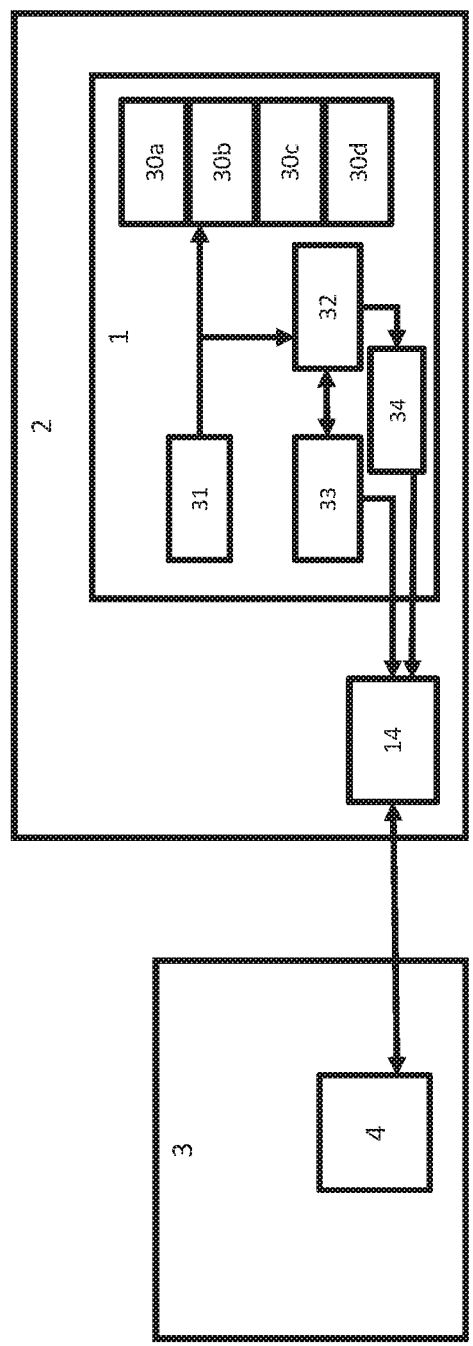
FIG. 4 is a schematic view of a fourth exemplary embodiment according to the present invention.

The illustration of FIG. 4 depicts a further exemplary embodiment. In FPGA 2, FPGA program 1 divides the BlockRAM into a plurality of partitions 30a, 30b, 30c, 30d. When a logic block 31 accesses a partition of the Block-RAM, the access address and the type of access; i.e., read or write, is processed by a monitoring module 32. In the case of write accesses, the monitoring module 32 checks whether the access address is a new reference value and saves the current reference value in a reference register 33. In the case of a read access, the access address is stored as a signal value in an access register 34. The monitoring program 4 on processor 3 can read out the reference value from reference register 33 and the signal value from access register 34 by way of controller 14. If the reference value is an upper threshold and the signal value is greater than the reference value, then an error is detected by monitoring program 4. If the reference value is a lower threshold and the signal value is less than the reference value, then an error is detected by monitoring program 4. For each partition, an upper threshold and/or a lower threshold may be provided.

Figure 5:
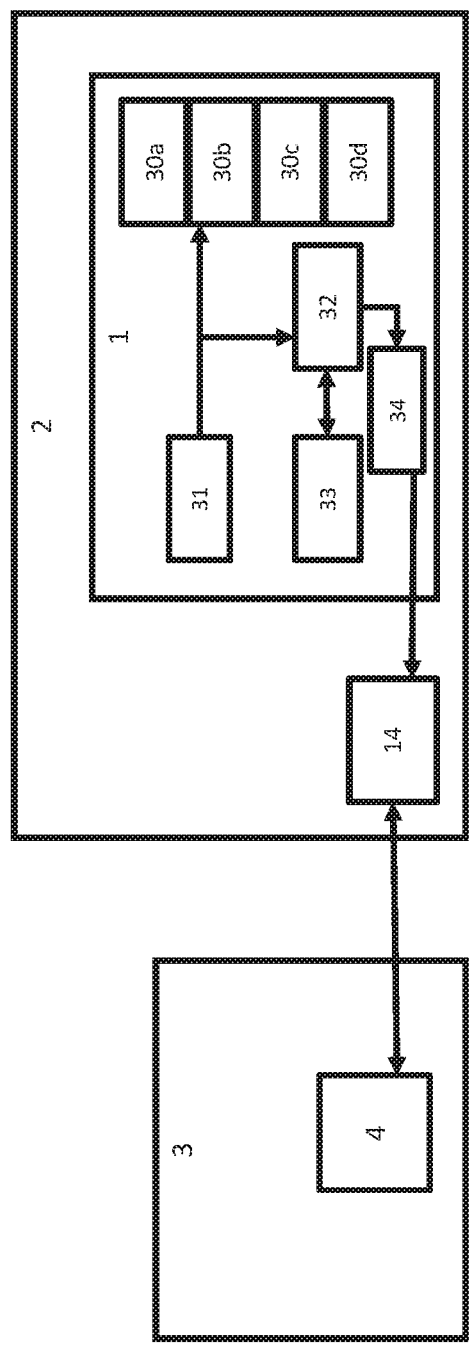
FIG. 5 is a schematic view of a fifth exemplary embodiment according to the present invention.

The illustration of FIG. 5 depicts a further exemplary embodiment. In the following, only the differences relative to FIG. 4 will be described. In this exemplary embodiment, monitoring module 32 checks directly during a read access whether the access address is greater than an upper threshold or less than a lower threshold. If the reference value is an upper threshold and the signal value is greater than the reference value, then monitoring module 32 stores, as a signal value, an error bit and/or the access address in access register 34. The signal value is read out by monitoring program 4.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for detecting errors of a field-programmable gate array (FPGA), comprising:
    testing, by a monitoring program executed on a processor in communication with the FPGA, communication between the FPGA and a further FPGA, wherein testing the communication between the FPGA and the further FPGA comprises:
        obtaining, by the monitoring program executed on the processor, a signal value from the FPGA prior to transmission of the signal value from the FPGA to the further FPGA;
        obtaining, by the monitoring program executed on the processor, a reference value from the further FPGA after transmission of the signal value from the FPGA to the further FPGA; and
        comparing, by the monitoring program executed on the processor, the signal value from the FPGA to the reference value from the further FPGA in order to detect whether an error has occurred in the communication between the FPGA and the further FPGA, wherein the signal value and the reference value are different, and wherein the monitoring program detects that an error has occurred in the communication between the FPGA and the further FPGA in response to determining that the reference value does not correspond to the signal value being changed by the further FPGA in a known manner.

2. A method for detecting errors of a first field-programmable gate array (FPGA) program, comprising:
    receiving, by a monitoring program executed on a processor connected to an FPGA on which the first FPGA program is executed, a signal value read out from the first FPGA program; and
    comparing, by the monitoring program executed on the processor, the signal value to a reference value from a source other than the first FPGA program in order to detect errors of the first FPGA program;
    wherein a plurality of comparisons between signal values and reference values are performed and combined;
    wherein respective signal values are compared to reference values more frequently based on memory locations and/or logic elements corresponding to the respective signal values being exposed to a higher thermal load relative to other signal values corresponding to memory locations and/or logic elements exposed to a lower thermal load.

3. The method as recited in claim 2, wherein the reference value is a predefined value.

4. The method as recited in claim 2, wherein the signal value and the reference value each specify a memory address in a BlockRAM of the FPGA.

5. The method as recited in claim 2, wherein an error of the first FPGA program is detected based on the signal value being greater than a first reference value and/or less than a second reference value.

6. The method as recited in claim 2, wherein the reference value is set after a write access to a BlockRAM of the FPGA.

7. The method as recited in claim 4, wherein the BlockRAM is divided into a plurality of partitions, and at least one reference value is used for each partition.

8. The method as recited in claim 2, wherein the reference value is dynamically generated in the processor.

9. The method as recited in claim 2, wherein the monitoring program sends a stimulation value to the FPGA.

10. The method as recited in claim 9, wherein the stimulation value overwrites a constant in the first FPGA program.

11. The method as recited in claim 1, wherein the signal value is read out from the FPGA via readback.

12. A system, comprising:
    a processor configured to execute a monitoring program; and
    a field-programmable gate array (FPGA) in communication with the processor; and
    a further FPGA in communication with the processor;
    wherein the first FPGA program is configured to transmit a signal value to the further FPGA; and
    wherein the monitoring program is configured to test communication between the FPGA and the further FPGA, wherein testing the communication between the FPGA and the further FPGA comprises:
        obtaining a signal value from the FPGA prior to transmission of the signal value from the FPGA to the further FPGA;
        obtaining a reference value from the further FPGA after transmission of the signal value from the FPGA to the further FPGA; and
        comparing the signal value from the FPGA to the reference value from the further FPGA in order to detect whether an error has occurred in the communication between the FPGA and the further FPGA, wherein the signal value and the reference value are different, and wherein the monitoring program detects that an error has occurred in the communication between the FPGA and the further FPGA in response to determining that the reference value does not correspond to the signal value being changed by the further FPGA in a known manner.

13. The method as recited in claim 2, wherein thermal load on memory locations is estimated via simulation.

14. The method as recited in claim 2, wherein the signal value is read out from the first FPGA program via readback.

* * * * *